United States Patent
Hoag et al.

(10) Patent No.: US 6,946,717 B2
(45) Date of Patent: Sep. 20, 2005

(54) HIGH VOLTAGE SEMICONDUCTOR DEVICE

(75) Inventors: David Russell Hoag, Walpole, MA (US); Timothy Edward Boles, Tyngsboro, MA (US); Daniel G. Curcio, Nashua, NH (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/470,481

(22) PCT Filed: Jan. 30, 2002

(86) PCT No.: PCT/US02/02592
§ 371 (c)(1),
(2), (4) Date: Jul. 25, 2003

(87) PCT Pub. No.: WO02/061836
PCT Pub. Date: Aug. 8, 2002

(65) Prior Publication Data
US 2004/0113231 A1 Jun. 17, 2004

Related U.S. Application Data
(60) Provisional application No. 60/265,052, filed on Jan. 30, 2001.

(51) Int. Cl.[7] .................. H01L 29/00; H01L 31/075
(52) U.S. Cl. .................. 257/528; 257/458; 257/449; 257/462; 257/489; 257/168; 257/259; 257/279; 257/293; 257/453; 257/471; 257/277; 257/275; 257/226; 257/233; 257/234; 257/292

(58) Field of Search .................. 257/458, 449, 257/462, 489, 168, 259, 279, 293, 453, 471, 277, 275, 226, 233, 234, 292, 528

(56) References Cited

U.S. PATENT DOCUMENTS

| | | | |
|---|---|---|---|
| 3,967,310 A | | 6/1976 | Horiuchi et al. |
| 5,126,701 A | * | 6/1992 | Adlerstein .................. 333/17.2 |
| 5,159,296 A | | 10/1992 | Nelson |
| 5,341,114 A | | 8/1994 | Calviello et al. |
| 5,343,070 A | | 8/1994 | Goodrich et al. |
| 6,034,725 A | * | 3/2000 | Franklin et al. ............ 348/310 |
| 2003/0116782 A1 | * | 6/2003 | Mizutani .................... 257/183 |

* cited by examiner

Primary Examiner—Allan R. Wilson
Assistant Examiner—Joseph Nguyen

(57) ABSTRACT

A compound semiconductor device is comprising a compound semiconductor substrate (219) having a ground plane (205); an active element (201) disposed on the substrate; a passive element (211) disposed on the substrate and electrically coupled to the active element; and an insulating layer (202) adjacent the substrate and interposed between the passive device and ground surface such that there is no resistive ground path from the passive device to the ground surface.

30 Claims, 2 Drawing Sheets

HIGH VOLTAGE SEMICONDUCTOR DEVICE

CROSS-REFERENCE TO RELATED APPLICATIONS

This application is a U.S. national stage application based on International Application No. PCT/US02/02592, filed Jan. 30, 2002, which claims priority benefit under 35 U.S.C.

RELATED APPLICATION

Priority of this application is based on Provisional Application No. 60/265,052, filed Jan. 30, 2001, and incorporated herein by reference

FIELD OF INVENTION

The present invention relates generally to high-voltage semiconductor devices, and, more specifically, to high-voltage compound semiconductor devices having active devices electrically coupled to passive devices.

BACKGROUND OF THE INVENTION

P Intrinsic N (PIN) Diodes are used commonly in an assortment of commercial and military applications as switches, phase shifters, and attenuators. Recently, a variety of multi-port PIN designs capable of operating at mmW frequencies have become available by integrating PIN diodes with passive elements on a common compound semiconductor substrate.

These new designs are representative of a type of device referred to herein as a "compound semiconductor device." As used herein, this term refers to a device which comprises a compound semiconductor substrate upon which are disposed active and passive elements where are electrically coupled together, either directly or indirectly. As used herein, the term "compound semiconductor" refers to any non-silicon-containing compound of two or more elements having an electrical conductivity between that of a conductor and a dielectric. Common compound semiconductors include III–V and II–VI group compounds such as gallium arsenide (GaAs) and zinc sulfur (ZnS), respectively. Typically, a compound semiconductor does not comprise a group IV element. The term "active element," as used herein, refers to an electrical component having at least two states between which there is no linear correlation, that is, the component switches between the states according to a step function. Examples of active elements include PIN diodes and transistors. Conversely, the term "passive element," as used herein, refers to an electrical component that has only one state, which, if it changes at all, changes linearly. Examples of passive elements include capacitors, inductors, resistors, and transmission lines. For illustrative purposes, specific reference is made to GaAs PIN diodes throughout this disclosure. It should be understood, however, that the invention is not limited to this particular type of compound semiconductor device.

An exemplary prior art GaAs PIN diode is disclosed in detail in U.S. Pat. No. 5,159,296 issued to Nelson and is shown in FIG. 1. The figure shows a compound semiconductor device 100 comprising an active component 101, which, in this case, is a PIN diode 101a, immediately adjacent a passive element 111, which, in this case, is a metallic transmission line 111a used to connect various circuit elements together. The transmission line 111a may be either parasitically coupled to the PIN diode or directly coupled using an additional metal layer. This particular transmission line 111a is a metal layer that is deposited on the surface of the semiconductor substrate 119 and is parasitically coupled to the PIN diode 101a. By configuring the device 100 in this manner, a Schottky junction 113 is formed between the ground plane 105 and the deposited metallic transmission line 111a. This junction can be represented as a diode 115 in series with a resistor 117 leading to ground.

A Schottky barrier is formed when a metal is placed in intimate contact with a semiconductor. A transfer of charge from the semiconductor to the adjoining metal will occur to satisfy the requirement for a continuous Fermi level across the metallurgical junction. The metal will accumulate electrons or holes along its surface and the semiconductor will form a depletion region of the opposite charge. Under ideal conditions, the magnitude of the potential barrier that develops from the transfer of charge is equal to the difference in the work functions between the metal and the semiconductor. In the case of GaAs, the potential barrier is more dependent on the density of surface states than it is on the type of metal that forms the Schottky junction. Thus, for GaAs, the surface state density is significant, which tends to pin the Fermi level such that the potential barrier will approximate 0.8 eV, independent of the Schottky metal. The characteristics of any Schottky junction will largely depend on the surface condition present during the deposition of the metal. Therefore, the processing steps used to prepare the surface for metallization are critical to the device characteristics and the overall-manufacturing yield.

The PIN diodes described above are well suited in applications where the RF signal power and the system potentials are low, such as in automotive applications that use a 12 volt system, since, at relatively low operating voltages, the amount of leakage current that flows from the transmission line 111a to ground is negligible. It is desirable, however, to use these PIN diode configurations in systems using higher energy signals such as missile systems that handle large RF signals and create sizable potentials across the PIN diodes. Unfortunately, when the voltage level increases past a certain breakdown point, a sizable leakage current flows from the junction 113 located between the metal transmission line 111a and the GaAs layer to ground, thereby rendering the circuit useless for normal operation. The applicants recognize that this current leakage is due to the inadequate insulating qualities of the GaAs at higher voltage levels. The semi-conducting nature of the GaAs substrate causes it to behave as a large-value resistor, meaning it is an insulator at lower voltage levels but conducts relatively large currents at higher voltage levels. It has been found the prior art PIN diode switches fail almost immediately and catastrophically when the potential increases to levels of 28–34 volts and above. Accordingly, as used herein, the term "high voltage" refers to potentials greater than 34 volts.

It is desirable to have a device that functions in a manner similar to the prior art devices, but that will withstand the higher voltage levels required by the high-energy signal systems found today.

SUMMARY OF THE INVENTION

The present invention provides an improved structure and preparation technique for a compound semiconductor device for use in high voltage applications. The compound semiconductor device of the present invention comprises a layer of insulating material between the compound semiconductor substrate and the passive element deposited thereon. The insulating layer is capable of withstanding significantly higher potentials and providing greater electrical isolation than the compound semiconductor substrate. Accordingly, rather than having a resistive path to ground through the semiconductor substrate, the device of the present invention behaves as if it has a resistor/capacitor (RC) coupling to ground.

This configuration offers a number of advantages over the prior art. First, it allows the device to function at voltage levels significantly higher than the 28–34 volt maximum facing prior art devices. Additionally, applicants have discovered that the insulating layer also improves the device's performance with respect to its return loss, output return loss, and insertion loss.

Accordingly, one aspect of the invention is a compound semiconductor device in which the passive device is isolated from ground by an RC coupling. In a preferred embodiment, the device comprises: (a) a compound semiconductor substrate having a ground surface; (b) an active element disposed on the substrate; (c) a passive element disposed on the substrate and electrically coupled to the active element; and (d) an insulating layer adjacent the substrate and interposed between the passive device and ground surface such that there is no resistive ground path from the passive device to the ground surface. Examples of high-voltage compound semiconductor devices of the present invention include, for example, a PIN diode switch, a monolithic amplifier, a voltage controlled oscillator, a phase shifter, a limiter, multiplier, or an attenuator.

In a particularly preferred embodiment, the insulating layer comprises multiple layers that are deposited in a way as to balance internal stresses therein. That is, applicants have discovered that the insulating layer material and substrate material tend to have different physical properties and react differently to thermal changes. Thus, after extended exposure to thermal cycles, the insulating layer may show signs of stress such as flaking and/or cracking. Applicants have minimized these effects by neutralizing internal stresses within the insulating layer. To this end, in a preferred embodiment, the insulator layer comprises two or more layers having opposing mechanical film stresses. For example, in a preferred embodiment, the insulating layer comprises a tensile layer in which the mechanical film stresses tend to deform the layer in a upward concave configuration and a compression layer in which the mechanical film stresses tend to deform the layer in a downward concave configuration. The mechanical film stresses in this arrangement tend to counteract each other resulting in a dimensionally stable layer over a relatively large thermal range.

Another aspect of the invention is the use of the compound semiconductor device in high voltage applications. In a preferred embodiment, the use comprises (a) providing a compound semiconductor device as described above, and (b) applying a high voltage potential between the passive element and ground. For example, the high voltage potential may be applied to the passive element for PIN diode switching, monolithic amplifying, voltage controlled oscillating, phase shifting, limiting, multiplying, and attenuating.

Another aspect of the invention is a system comprising the high-voltage compound semiconductor described above. Examples of such systems include, for example, opto electronic high speed switching networks, high power phased array radar systems, and high power seeker heads in missile systems.

DETAILED DESCRIPTION OF THE INVENTION

Figure 1:
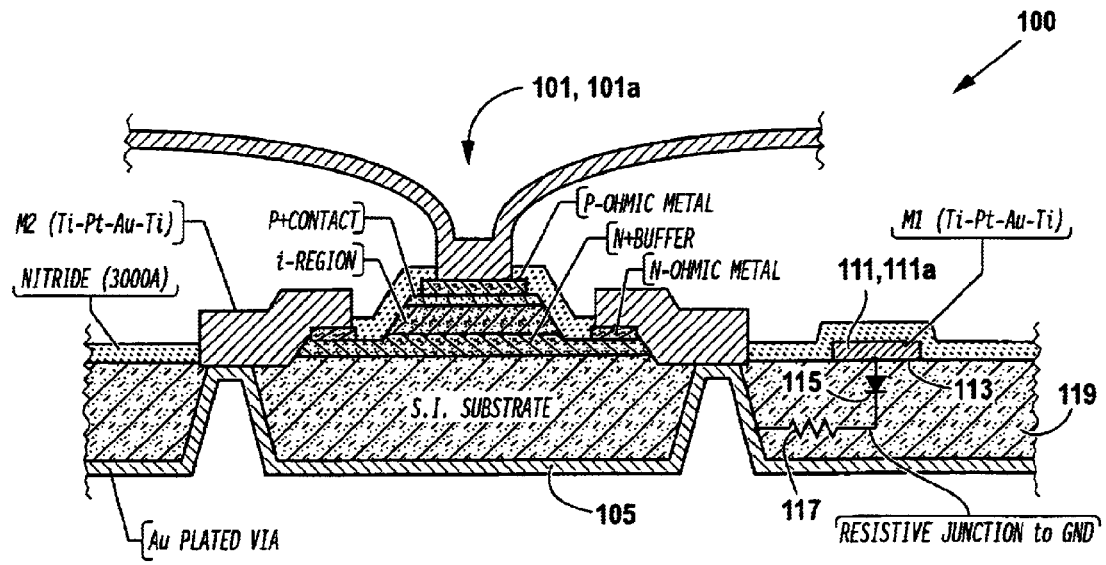
FIG. 1 is a cross-sectional view of a device in accordance with the prior art.
Figure 2:
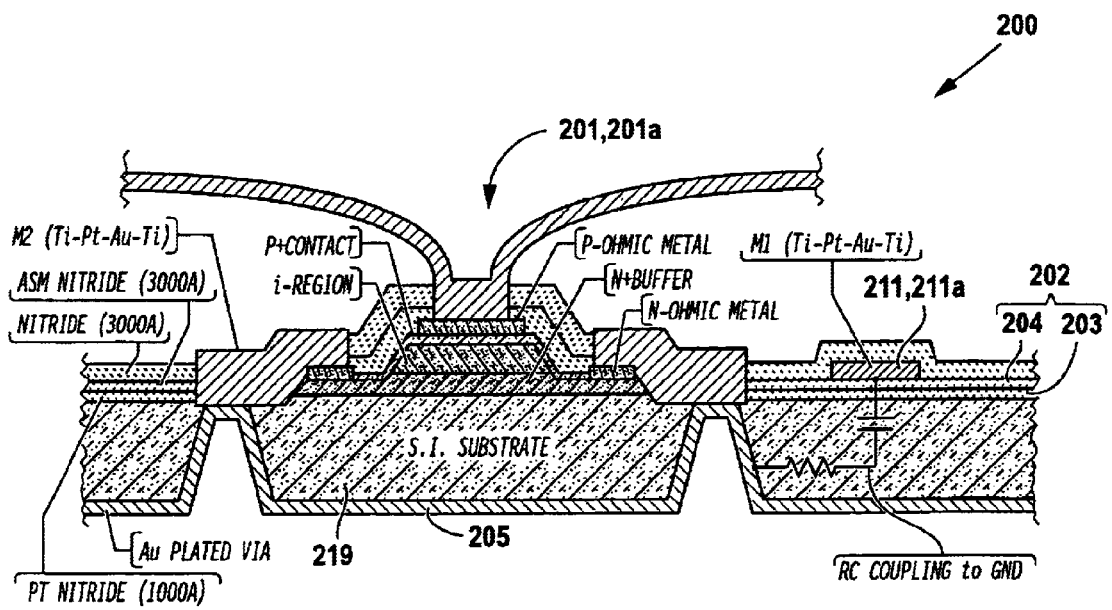
FIG. 2 is a cross-sectional view of a device in accordance with the present invention.

A preferred embodiment of the invention is shown in FIG. 2. As shown, a compound semiconductor device 200 comprises (a) a compound semiconductor substrate 219 electrically coupled to a ground surface 205; (b) an active element 201 disposed on the substrate 219; (c) a passive element 211 disposed on the substrate 219 and electrically coupled to the active element 201; and (d) an insulating layer 202 adjacent the substrate 219 and interposed between the passive device 211 and the ground surface 205 such that there is no direct resistive ground path from the passive device to the ground surface.

The substrate 219 comprises a compound semiconductor, which, as defined above, is any non-silicon-containing compound of two or more elements having an electrical conductivity between that of a conductor and a dielectric. Preferred compound semiconductors include III–V and II–VI group compounds, such as GaAs, AlGaAs, InP, InGaAs, GaN, AlN, GaP, INAs, AlSb, GaSb, InSb, InGaAs, InGaP, ZnSe, ZnS, and HgCdTl. More preferably, the compound semiconductor material is GaAs.

The active element 201 is disposed on the substrate 219 using known techniques. As mentioned above, the active element may be any electrical component having at least two states between which there is no linear correlation, that is, the component switches between the states according to a step function. Preferably, the active element comprises at least one of a diode (e.g., a P Intrinsic N (PIN) Diodes, photo diode, light emitting diode (LED), varactor diodes), a transistor (e.g., junction field effect transistor (JFET), Bipolar transistor or bipolar junction transistor (BJT), hetero junction bipolar transistors (HBT)), and opto-electronic devices such as lasers (e.g., vertical cavity surface emitting laser (VCSEL), double channel, planar buried heterostructure (DC-PBH), buried crescent (BC), distributed feedback (DFB), distributed bragg reflector (DBR), etc.), light emitting diodes (LEDs) (e.g. surface emitting LED (SLED), edge emitting LED (ELED), super luminescent diode (SLD), etc.) and photodiodes (e.g., avalanche photodiode (APD)). More preferably, the active element comprises a PIN diode 201a as shown in FIG. 2.

The passive element 211 is disposed on the substrate 219 also using known techniques. As mentioned above, the passive element may be any electrical component which has only one state which, if it changes at all, changes linearly. Preferred passive elements include capacitors, inductors, resistors, and transmission lines. More preferably, the passive element is a transmission line as shown in FIG. 2. It has been found that a transmission line comprising a stack of layers of titanium, platinum, and gold (Ti—Pt—Au—Ti) provides acceptable results.

The passive element 211 is separated from the substrate by an insulating layer 202. The insulating layer is capable of maintaining a potential of preferably at least 40 volts, more preferably, at least 100 volts, and even more preferably at least 250 volts. To this end, the layer must comprise a suitable material and have a suitable thickness.

The insulating layer 202 can be any dielectric material which has a resistivity of at least $1 \times 10^{10}$ Ω/cm, and, preferably, at least $1 \times 10^{11}$ Ω/cm. Preferably, the thermal expansion of the dielectric material is matched to that of the substrate to provide a more robust package which does not degrade appreciably as the device thermally cycles. In other words, the thermal expansion characteristics of the insulating layer should approximate those of the substrate. Therefore, the choice of dielectric material will be dependent somewhat on the compound semiconductor substrate used. One can readily determine the compatibility of certain dielectric with certain dielectrics by assessing, for example, the coefficients of thermal expansion (CTE) of the materials. Suitable dielectric materials include, for example, ceramic materials which are oxides, nitrides, carbides, borides and suicides and combinations thereof. Examples of such suitable materials include, but are not limited to, aluminum nitride, silicon nitride, aluminum oxide, tin oxide, titanium carbide, hafnium oxide, zirconium oxide, titanium oxide and dioxide, lithium aluminate. In the preferred embodiment in which the substrate is GaAs, the insulating layer preferably comprises silicon nitride ($Si_3N_4$) because $Si_3N_4$ is a high-resistivity dielectric, has favorable mechanical properties and is easily deposited on GaAs.

One skilled in the art can determine the thickness required for a given material to support the above-mentioned potentials using empirical methods. For example, it was observed that for each 50 volts of potential, the layer of insulating layer of $Si_3N_4$ should increase in thickness by 1000 angstroms. Accordingly, by adding an insulating layer of $Si_3N_4$ that is 4000 angstroms thick, the device of the present invention can theoretically withstand potentials of at least 228 volts (wherein 200 volts insulation is provided by the 4000 angstroms thick $Si_3N_4$ layer and 28 volts insulation is provided by the semiconductor).

While a sufficiently thick insulating layer between the metal layer 201 and the semi-conducting substrate 205 is desirable to raise the breakdown voltages associated with the device, applicants have discovered that it is not possible to simply deposit a 4000 angstroms thick insulating layer upon the semiconductor substrate to achieve the desired result. Specifically, with respect to a preferred embodiment, a layer of $Si_3N_4$ of sufficient thickness will experience cracking after extended exposure to thermal fluctuations. These cracks are caused by the dissimilar thermal expansion properties of the $Si_3N_4$ and the GaAs. Once the insulating layer begins to crack, its performance is compromised and eventually it will fail.

In order to overcome these mechanical stress concerns, the insulating layer in accordance with the present invention is deposited in such a way as to neutralize its thermal expansion characteristics. For example, with respect to a preferred embodiment, the insulating layer comprises two separate layers of $Si_3N_4$. The stresses in the each of the two separate $Si_3N_4$ layers are controlled to be matched in CTE strength but opposite in direction. In the preferred embodiment, a first layer of $Si_3N_4$ 203 is deposited directly on the GaAs substrate using a high frequency plasma (approximately 13.66 MHz) deposition. This creates a tensile layer of $Si_3N_4$ 203. A tensile layer is one in which the mechanical stress force vectors within the layer tend to pull inward toward the center of the layer. This creates a tendency for the layer to curl upward after it is deposited on the GaAs substrate. A second layer of $Si_3N_4$ 204 is then deposited as a compressive layer using a low frequency plasma (approximately 200 kHz) deposition. A compressive layer is one in which the mechanical stress force vectors within the layer tend to push outward toward the edges of the layer. This creates a tendency for the layer to cup downward after it is deposited. The two separate layers of $Si_3N_4$ are designed to achieve a balance between the mechanical stresses within the insulating layer, thus reducing the overall mechanical stress present in the insulating layer 202. Preferably, the combination of the two layers results in an insulating layer 202 with a zero sum stress or nearly a zero sum stress. This prevents the device from exhibiting cracking and flaking of the insulating layer as the device is exposed to thermal fluctuations.

By creating a device with an insulating layer in accordance with the present invention located between the passive circuit elements and the semi-conductor substrate, the breakdown voltage of the devices is substantially increased. This allows the device to be used in larger signal applications that use higher voltage levels. It has been found that potentials can be applied between the passive element and ground exceeding about 40 volts, preferably exceeding about 100 volts, and even more preferably exceeding about 200 volts. Examples of systems using larger signal applications include, for example, opto electronic high speed switching networks, high power phased array radar systems, and high power seeker heads in missile systems. In a preferred embodiment, the device is used as a PIN switch in a high power seeker head in a missile system to switch between transmit and receive modes.

EXAMPLE

The following non-limiting example is illustrative of the practice of the present invention. Reference is made to FIG. 2 when applicable.

A wafer of GaAs was provided as a substrate 219 for the compound semiconductor device 200. Before depositing the PIN diode 201a and transmission line 211a on the substrate 219, the insulating layer of $Si_3N_4$ was formed. The $Si_3N_4$ layer was deposited in two steps. First, a 1000 angstroms thick layer was applied using a high frequency plasma (approximately 13.66 MHz) deposition to create a tensile layer. Next, a 3000 angstroms thick layer was deposited on top of the 1000 angstroms layer using a low frequency plasma (approximately 200 kHz) deposition.

Using a metal liftoff technique, various layers were deposited on the substrate to form the PIN diode 201a and transmission line 211a. Of particular interest was the I region of the PIN diode device which was increased in thickness to support higher voltages. It was found that this increase in thickness resulted in sporadic occurrences of mechanical damage to the diode mesa during the forming process. It was determined that the damage resulted from inadequate photo resist coverage using the standard 4 um thick resist. As a result, the edges of the mesa were susceptible to tearing during the liftoff technique. This problem was solved by increasing the resist thickness used in the I-region, N-ohmic and Metal 1 process to 6 um to compensate for the 2 um increase in thickness to the insulating I-region.

The transmission line 211a was produced by depositing a metal stack of layers on the substrate 219. The stack comprised titanium, platinum, gold, and titanium (i.e., Ti—Pt—Au—Ti).

The device was thermally stressed and tested for breakdown voltage. The device was able to support potentials in excess of 250V without any sign of degradation. In addition, the device was subjected to an accelerated life test. The device was burned in at 125° C. with a bias of 56V over incremental periods of 168, 340, 500, and 1000 hrs. At each time interval, the device was evaluated at 56V and 70V with no signs of degradation.

Figure 3:
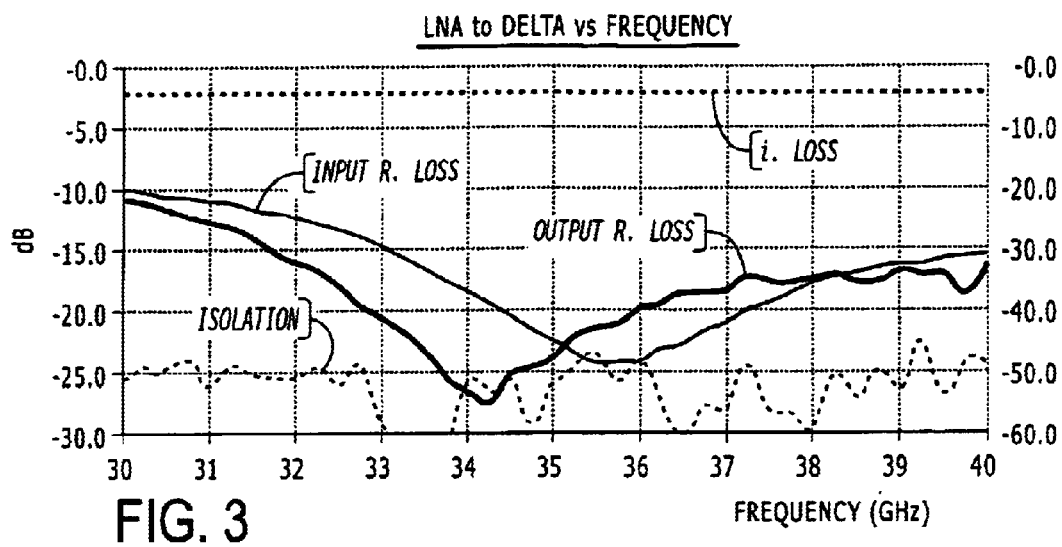
FIG. 3 is a graph of the input return loss, output return loss, and the insertion loss measured using an LNA to DELTA port configuration.
Figure 4:
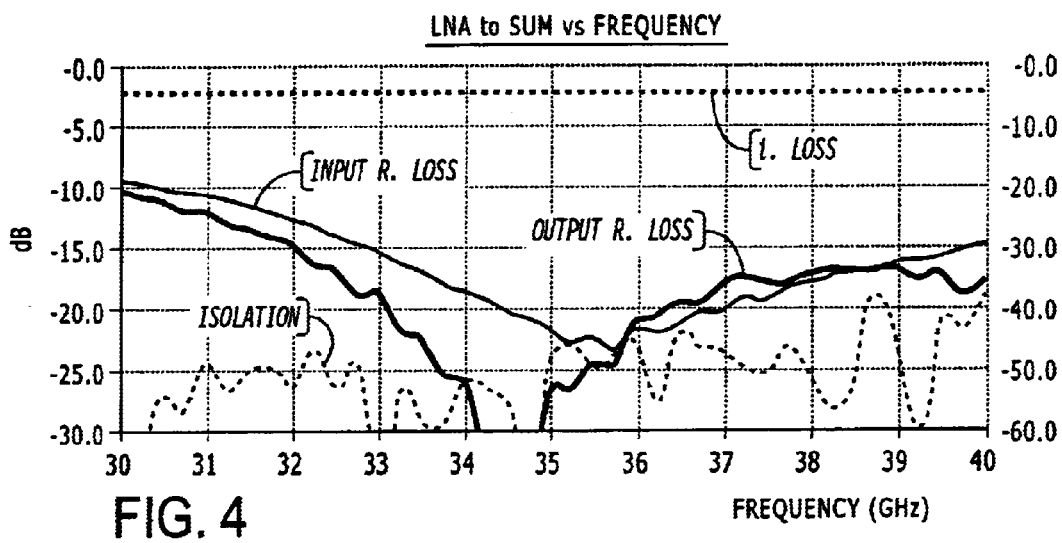
FIG. 4 is a graph of the input return loss, output return loss, and the insertion loss measured using an LNA to SUM port configuration.
Figure 5:
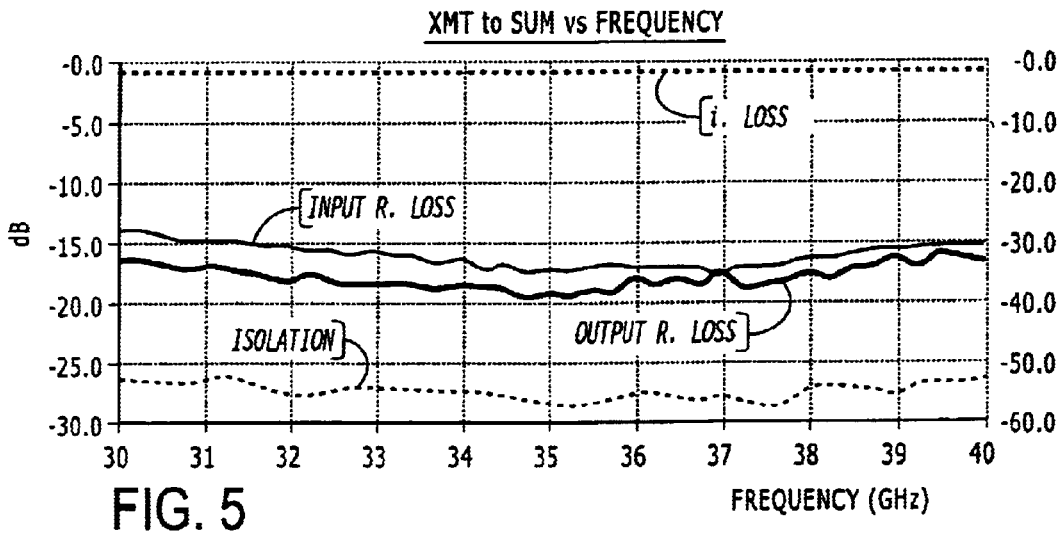
FIG. 5 is a graph of the input return loss, output return loss, and the insertion loss measured using an XMT to SUM port configuration.

The RF performance of the device was measured from 30 GHz to 40 GHz. The device generated was a 3-pole, 3-throw switch, with the three terminals labeled LNA, DELTA, and SUM. The Input Return Loss, Output Return Loss, and the Insertion Loss were measured using an LNA to DELTA port configuration, and LNA to SUM port configuration, and an XMT to SUM port configuration. The results of the tests are shown in FIGS. 3, 4, and 5, respectively. Apparently, the addition of the nitride insulating layer actually improved overall high frequency performance by several tenths of a dB. It is theorized that this is as a result of the nitride layer acting as a much better dielectric relative to the high frequency transmission characteristics as compared to the GaAs substrate.

It should be understood that the foregoing is illustrative and not limiting, and that obvious modifications may be made by those skilled in the art without departing from the spirit of the invention. Accordingly, the specification is intended to cover such alternatives, modifications, and equivalences as may be included within the spirit and scope of the invention as defined in the following claims.

We claim:

1. A compound semiconductor device comprising: a compound semiconductor substrate having a ground surface; an active element disposed on said substrate; a passive element disposed on said substrate and electrically coupled to said active element; and an insulating layer adjacent said substrate and interposed between said passive element and said ground surface such that there is no resistive ground path from said passive element to said ground surface.

2. The device of claim 1, wherein said insulating layer is capable of insulating across a potential of at least 40V.

3. The device of claim 2, wherein said insulating layer is capable of insulating across a potential of at least 100V.

4. The device of claim 3, wherein said insulating layer is capable of insulating across a potential of at least 200V.

5. The device of claim 1, wherein said insulating layer comprises a dielectric having a resistivity of at least $1 \times 10^{11} \Omega$-cm.

6. The device of claim 1, wherein said insulating layer comprises at least one of oxides, nitrides, carbides, borides and suicides.

7. The device of claim 6, wherein the insulating layer comprises $Si_3N_4$.

8. The device of claim 1, wherein said substrate comprises group III–V or group II–VI compounds or a combination thereof.

9. The device of claim 8, wherein said substrate comprises at least one of GaAs, AlGaAs, InP, InGaAs, GaN, AlN, GaP, INAs, AlSb, GaSb, InSb, InGaAs, InGaP, ZnSe, ZnS, and HgCdTl.

10. The device of claim 9, wherein said substrate comprises GaAs.

11. The device of claim 10, wherein the insulating layer comprises $Si_3N_4$.

12. The device of claim 1, wherein said active element is at least one of a diode, a transistor or an opto-electric device.

13. The device of claim 12, wherein said active element is a PIN diode.

14. The device of claim 1, wherein said passive element is at least one of a capacitor, inductor, resistor, or transmission line.

15. The device of claim 14, wherein said passive element is a transmission line.

16. The device of claim 15, wherein said active element is a PIN diode, said transmission line has a metallic layer, said substrate comprises GaAs, and said insulating layer comprises $Si_3N_4$.

17. The device of claim 16, wherein said metal layer is parasitically coupled to an active device.

18. The device of claim 1, wherein said insulating layer comprises: a first insulating layer having a first film stress in first direction; and a second insulating layer deposited on top of said first insulating layer and having a second film stress in a second direction different from the first direction; wherein said insulating layer has an overall stress that is less than the stress of said first layer and less than the stress of said second layer.

19. The device of claim 18, wherein said first and second directions are opposite.

20. The device of claim 18, wherein said overall stress is about zero.

21. The device of claim 18, wherein said first insulating layer is a compressive layer and said second insulating layer is a tensile layer.

22. The device of claim 21, wherein said first insulating layer is a 1000 Å thick layer of $SiN_4$, and said second insulating layer is a 3000 Å thick layer of $SiN_4$.

23. The device of claim 1, wherein said insulating layer is between said passive element and said substrate.

24. A method of using a compound semiconductor device comprising a compound semiconductor substrate having a ground surface; an active element disposed on said substrate; a passive element disposed on said substrate and electrically coupled to said active element; and an insulating layer adjacent said substrate and interposed between said passive element and said ground surface such that there is no resistive ground path from said passive element to said ground surface, said method comprising: providing a potential of at least about 40 volts between said passive element and said ground surface.

25. The method of claim 24, wherein said potential is at least about 100V.

26. The method of claim 25, wherein said potential is at least about 200V.

27. The method of claim 24, wherein by providing said potential to said passive element, said device performs at least one of PIN diode switching, monolithic amplifying, voltage controlled oscillating, phase shifting, limiting, multiplying, and attenuating.

28. A system comprising a compound semiconductor device comprising a compound semiconductor substrate having a ground surface; an active element disposed on said substrate; a passive element disposed on said substrate and electrically coupled to said active element; and an insulating layer adjacent said substrate and interposed between said passive element and said ground surface such that there is no resistive ground path from said passive element to said ground surface.

29. The system of claim 28, wherein said system is one of an opto-electronic switching networks, high-power phased array radar system, or a high-power seeker head in a missile systems.

30. The system of claim 28, wherein said insulating layer is between said passive element and said substrate.

* * * * *